United States Patent [19]

Green et al.

[11] 4,413,052

[45] Nov. 1, 1983

[54] PHOTOPOLYMERIZATION PROCESS EMPLOYING COMPOUNDS CONTAINING ACRYLOYL GROUP AND ANTHRYL GROUP

[75] Inventors: George E. Green, Stapleford, England; Ewald Losert, Rheinfelden, Switzerland; John G. Paul, Falkirk, Scotland

[73] Assignee: Ciba-Geigy Corporation, Ardsley, N.Y.

[21] Appl. No.: 361,701

[22] Filed: Mar. 25, 1982

[30] Foreign Application Priority Data

Feb. 4, 1981 [GB] United Kingdom ............... 8110403

[51] Int. Cl.$^3$ ............................................. G03C 5/00
[52] U.S. Cl. ............................ 430/327; 204/159.14; 204/159.22; 430/270; 430/328
[58] Field of Search ............... 430/281, 327, 328, 270; 204/159.14, 159.22

[56] References Cited

U.S. PATENT DOCUMENTS

| | | | |
|---|---|---|---|
| 2,980,535 | 4/1961 | Schroeder | 96/35 |
| 3,113,022 | 12/1963 | Cassiers et al. | 96/1 |
| 3,131,060 | 4/1964 | Cassiers et al. | 96/1 |
| 3,316,087 | 4/1967 | Munder et al. | 96/1 |
| 3,807,999 | 4/1974 | De Schrijver et al. | 96/27 F |
| 3,923,762 | 12/1975 | Stolka et al. | 260/89.5 |
| 4,291,118 | 9/1981 | Boduch et al. | 430/313 |

OTHER PUBLICATIONS

M. Stolka, Macromolecules, 1975, 8(1), 8-9.
G. I. Lashkov et al., Chem. Abs. 1974, 81,13857g.

*Primary Examiner*—Jack P. Brammer
*Attorney, Agent, or Firm*—Luther A. R. Hall

[57] ABSTRACT

In a three stage process, a layer of a liquid composition containing a compound (A) having in the same molecule both at least one (meth)acryloyl group and at least one anthryl group is exposed to actinic radiation so that the layer solidifies due to photopolymerization of (A) through the (meth)acryloyl group(s), remaining, however, further photocrosslinkable. When desired, the solidified layer is exposed, as through a negative, to a substantially greater amount of actinic radiation, the parts so further exposed becoming more highly photocrosslinked through the anthryl group(s) and hence insoluble. An image is produced which can be developed by means of suitable solvents. Examples of (A) include 3-(acryloyloxy)-2-hydroxypropyl anthracene-9-carboxylate and its methacryloyl homologue.

16 Claims, No Drawings

PHOTOPOLYMERIZATION PROCESS EMPLOYING COMPOUNDS CONTAINING ACRYLOYL GROUP AND ANTHRYL GROUP

BACKGROUND OF THE INVENTION

This invention relates to a photopolymerisation and photocrosslinking process, and in particular to such a process for the production of images.

Conventionally, production of an image by means of photopolymerisation is achieved by coating a support with a solution in a volatile organic solvent of a photopolymerisable substance, causing or allowing the solvent to evaporate so leaving a film of the photopolymerisable substance, irradiating the film with actinic radiation as through an image whereby the parts of the film struck by the irradiation become photopolymerised (and less soluble) while those parts shielded from the irradiation remain substantially unaffected, then dissolving away the unirradiated, unphotopolymerised parts of the film by means of a suitable solvent which does not dissolve the irradiated, photopolymerised parts. This last stage is conventionally known as "development".

It would be desirable to have a process in which a layer of a photopolymerisable substance were applied to a support and this layer were converted into a substantially solid, nontacky state, for irradiation, without the use of organic solvents. Not only would, in this stage, the use be avoided of solvents which might present problems of toxicity and flammability and also cause expense in their recovery, but the production on a continuous basis of coated supports, ready for irradiation, would be facilitated.

We have found that this object can be achieved by the use of certain substances which contain in the molecule two kinds of groups through which photopolymerisation can occur at rates which differ considerably from one another. The groups are chosen so that photopolymerisation of a layer of a liquid composition occurs rapidly to form a solid, essentially tack-free layer, which is, however, still soluble in certain solvents. When desired, parts of the layer are further subjected to a substantially greater amount of actinic radiation and photocrosslinking takes place through the other type of group in the already photopolymerised molecules of the layer, the parts of the layer which undergo photocrosslinking becoming much more resistant to solution in the solvents.

Unpublished experiments by the Applicants have shown that numerous potentially useful compounds, containing two types of units normally capable of undergoing photopolymerisation, do not give satisfactory results in such a process, photopolymerisation in the first stage being much retarded, apparently as a consequence of the presence in the molecule of another type of photopolymerisable unit, despite the incorporation of a variety of photoinitiators and photosensitisers. In other unpublished experiments of the Applicants, mixtures of two compounds, one containing a unit normally capable of undergoing photopolymerisation and the other having a different unit normally capable of undergoing photocrosslinking, gave unsatisfactory results, apparently due to inhibition of the photocrosslinking reaction.

It has been found that the desired process can be achieved by employing a compound which contains in the same molecule both at least one acryloyl or methacryloyl group and at least one anthryl group.

U.S. Pat. No. 2,980,535 describes the production of photopolymerisable polymers incorporating anthracene moieties. Thus, light-sensitive polymers are obtained by acetalisation of polyvinyl alcohol with anthracene-9-aldehyde: in order to increase the solubility of the product in, e.g., chlorinated aliphatic hydrocarbons, it is treated with acetic anhydride to give an acetylated acetal containing units of formula

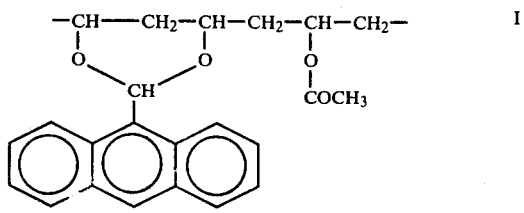

In other Examples polyvinyl acetate is partially saponified and an acetal is formed with anthracene-9-aldehyde, or polyvinyl butyral is transacetalised with anthracene-9-aldehyde. There is no suggestion of forming a still photocrosslinkable product containing anthracene moieties by photopolymerising a compound containing both acryloyl or methacryloyl groups and anthracene moieties.

British Pat. No. 940,878 describes electrophotographic material comprising an electrically conductive support having a photoconductive coating which includes a polymer of an aromatic or heterocyclic ester of acrylic acid or of an alpha-alkyl acrylic acid. The polymer contains units of formula

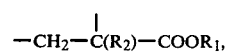

where $R_1$ represents a substituted or unsubstituted aryl, aralkyl, heterocyclic or heterocyclic alkyl residue and $R_2$ represents a hydrogen atom or an alkyl residue. Preferred residues $R_1$ include those derived from anthracene; suitable monomers can be prepared by reacting a hydroxyl-containing anthracene derivative such as 2-hydroxyanthracene, 9-hydroxyanthracene or 9-hydroxymethylanthracene with acryloyl chloride. The polymers may be obtained by conventional polymerisation processes using catalysts such as peroxides or azo compounds. The photoconductive coating is formed by applying the polymer to the support in the form of a solution in an organic solvent or an aqueous or non-aqueous dispersion, and then removing the liquid medium by evaporation. In the formation of an electrophotographic image, the coating is charged by means of a corona discharge and then exposed behind a master to UV light emitted by high pressure mercury vapour lamps; it is then dusted with a developer which adheres to the parts not affected by light during the exposure to render visible an image corresponding to the master.

French Patent No. 2 272 107 discloses anthracenic monomers of formula

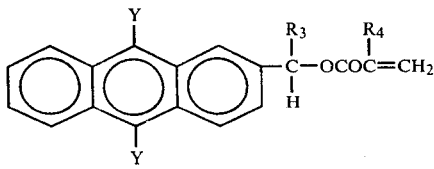

where $R_3$ and $R_4$ each represent a hydrogen atom or an alkyl group and X and Y each represent a hydrogen, chlorine, or bromine atom or an alkyl or phenyl group, and the preparation of such monomers. The 2-anthryl monomers were polymerised by standard free radical-initiated addition polymerisation techniques. It is stated that it is desirable to protect the monomers from electromagnetic radiation during polymerisation, because it is well known that electronically excited anthracene groups can inhibit free radical polymerisation. The polymers produced are said to be high molecular weight materials suitable for use in photoconductive layers in electrophotographic processes. The preferred polymers are homopolymers of 2-anthrylmethyl methacrylate and 1-(2-anthryl)ethyl methacrylate and copolymers of these methacrylates with methyl methacrylate.

The inventor in the foregoing patent also described the preparation and polymerisation of the 2-anthryl substituted monomers in Macromolecules, 1975, 8 (1), 8-9. In referring to the problems associated with the polymerisation of vinyl monomers containing anthracene groups, he stated (i) that the extreme reactivity of the anthracene group towards free radicals made it impossible to synthesise a high molecular weight polymer of 9-vinylanthracene, (ii) that anthracene did not interfere with the radical polymerisation of methyl methacrylate in the absence of UV radiation, and (iii) that light-induced polymerisation of methyl methacrylate in the presence of benzoyl peroxide was also inhibited by anthracene. He proceeded from these statements to relate that he assumed that the methacrylate group attached to anthracene by a covalent bond should be polymerisable. He then described the experiments providing the correctness of that assumption; the polymerisation of 1-(2-anthryl)ethyl methacrylate was carried out whilst protecting the reactants from light.

G. I. Lashkov et al., in Doklady Akademii Nauk SSR, 1974, 214 (4), 850-853 described the photodimerisation of polymers containing anthracene groups in solution in dioxane. The polymers mentioned (their preparation is not described) include a homopolymer of 9-anthrylmethyl methacrylate and a copolymer thereof with methyl methacrylate.

U.S. Pat. No. 3,807,999 discloses the photo-cycloaddition polymerisation of bis-anthracenes of formula A—$(CH_2)_q$OCOR$_5$COO$(CH_2)_q$—A or A—COOR$_5$OCO—A, where each A denotes a 9-anthryl group, $R_5$ denotes an alkylene group, and q is 1 or 2. Polymerisation is effected by exposing to ultraviolet radiation at 365 nm. The polymerisation is said to be reversible: the polymers formed can be degraded by heating or by irradiation at 254 nm and the degraded products can be repolymerised by irradiation at 365 nm. Most of the polymers are said to be soluble in haloalkanes; where they become insoluble in these solvents as a result of crystallisation, they are found to be soluble in dimethyl sulphoxide; this is said to prove that no crosslinked structures are formed. A method of recording information is described in which a polymer formed by photocycloaddition is applied to a support and imagewise exposed to heat, for instance using an infrared laser. The image thus formed can be scanned with a UV laser and recorded with a photocell sensitive to the eximer-fluorescence occurring in those places where the polymer has been degraded by the infrared laser.

U.S. Pat. No. 3,131,060 discloses photoconductive vinyl polymers having recurring groups of formula

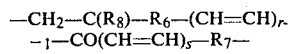

where $R_6$ represents an aromatic or heterocyclic nucleus, $R_7$ represents an aromatic nucleus such as an anthracene nucleus, or a heterocyclic nucleus; $R_8$ represents a hydrogen atom or a lower alkyl group: and r and s are each 1 or 2. The polymers can be prepared by various techniques, initiation occurring by free radicals, ion formation or radiation with actinic light. Polymerisation may also be carried out in situ on a support. An example describes the reaction of poly(vinylacetophenone) and 9-anthraldehyde to give a polymer of the above formula where $R_6$ represents a benzene nucleus, $R_7$ represents an anthracene nucleus, $R_8$ represents a hydrogen atom, and r and s are 1.

U.S. Pat. No. 3,113,022 also discloses photoconductive polymers of the type disclosed in the foregoing patent, as well as many other types of photoconductive polymer. The use of the polymers in electrophotographic processes is described. It is stated that in such processes, insolubilisation of the polymers does not occur, or, if it does occur, does not play a role of any importance in the image-recording process; the illumination necessary for obtaining the conductive latent image is much smaller than that necessary for inducing crosslinking of the polymers.

In a recently published U.S. Pat. (No. 4,291,118) there is described a method for relief imaging a liquid polymeric composition, in which a layer of the composition is subjected to a first polymerisation treatment by exposure to actinic radiation, chemical hardening occurring sufficient to solidify the layer, then the solidified mass is further reacted with polymerising actinic radiation in a pattern, such that the solidified mass in the pattern is in a different chemical condition from that not in the pattern, and finally the portion solidified only by the first exposure to actinic radiation is selectively removed, such as by a solvent, to leave as a relief image the portion of the solidified mass which had been subjected to the further polymerising actinic radiation.

The only polymeric compositions named are conventional polyene-polythiol mixtures and in the Example such a mixture which is described as being commercially available is employed. There is no suggestion of using a compound containing two chemically different groups through which photopolymerisation and subsequently crosslinking could be achieved.

SUMMARY OF THE INVENTION

One aspect of this invention accordingly provides a process for production of an image which comprises (1) exposing to actinic radiation a layer, supported on a carrier, of a liquid composition containing a compound (A) having in the same molecule both at least one group of formula

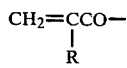

and at least one group of formula

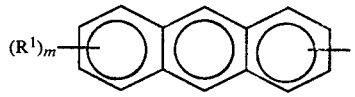

where

R denotes a hydrogen atom or a methyl group,

R¹ denotes a chlorine or bromine atom, a methyl group, or a nitro group, and m is zero, 1, or 2, such that the layer solidifies and becomes essentially nontacky due to photopolymerisation of (A) through the group or groups of formula III but remains substantially photocrosslinkable and subsequently, when desired, (2) exposing through an image-bearing transparency consisting of substantially opaque and substantially transparent parts the layer so solidified to a substantially greater amount of actinic radiation such that the further exposed part or parts of the photopolymerised layer undergo photocrosslinking through the group or groups of formula IV, and (3) developing the image by dissolving in a solvent parts of the layer which have not become crosslinked.

DETAILED DISCLOSURE

Usually the compound (A) employed in the process of this invention will contain, per average molecule, up to four groups of formula III and up to four groups of formula IV; generally it has a molecular weight of at most 2,000. Preferably the group or groups of formula III, and preferably also the group or groups of formula IV, are each directly attached to an atom or atoms of carbon, oxygen, or nitrogen; particularly preferred are compounds in which the group or groups of formula IV are 1-anthryl, 2-anthryl, or especially 9-anthryl groups.

Compounds suitable for use as (A) may be obtained by reaction, in either order, of a compound having two or more glycidyl groups directly attached to an atom or atoms of oxygen, nitrogen, or sulphur with acrylic or methacrylic acid and with an anthracenecarboxylic acid of formula

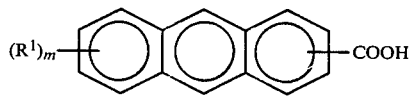

where R¹ and m have the meanings assigned in formula IV, particularly anthracene-1-carboxylic acid, anthracene-2-carboxylic acid, or anthracene-9-carboxylic acid.

Compounds also suitable for use as (A) may be obtained in an analogous manner, employing in place of the anthracenecarboxylic acid of formula V a hydroxyanthracene of formula

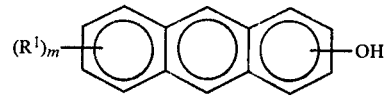

where R¹ and m have the meanings assigned in formula IV; especially 1-anthranol and 2-anthranol.

Compounds suitable for use as (A) may similarly be obtained employing in place of the anthracenecarboxylic acid of formula V an anthracene-containing alcohol of formula

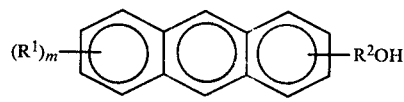

R¹ and m have the meanings assigned in formula IV and

R² denotes an alkylene or alkylidene group of 1 to 4 carbon atoms such as a methylene or ethylene group, especially 1-(hydroxymethyl)anthracene and 1-(2-anthryl)-ethanol.

Still further compounds suitable for use as (A) may be obtained in a similar manner, employing in place of the anthracenecarboxylic acid of formula V an aminoanthracene of formula

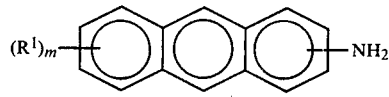

where R¹ and m have the meanings assigned in formula IV, such as 2-aminoanthracene and 9-aminoanthracene.

Yet other compounds suitable for use as (A) may be obtained in a similar manner, employing an anthracenesulphonic acid of formula

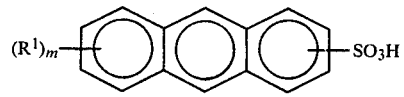

where R¹ and m have the meanings assigned in formula IV, such as anthracene-2-sulphonic acid and anthracene-9-sulphonic acid, in place of the anthracenecarboxylic acid of formula V.

If desired, in the case where an anthracene-containing carboxylic acid, phenol, or sulphonic acid is used, it may be added to the polyglycidyl compound at the same time as the (meth)acrylic acid.

There may thus be used as compound (A) substances of the general formula

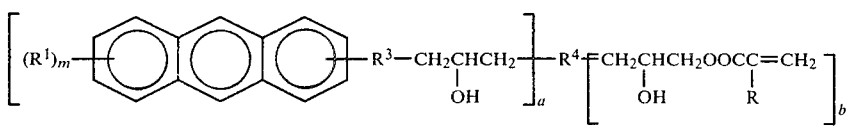

where
R has the meaning assigned in formula III,
$R^1$ and m have the meanings assigned in formula IV,
$R^3$ denotes a group of formula —COO—, —O—, —$R^2$O—, —NH—, or —$SO_3$—, where $R^2$ has the meaning assigned in formula VII,
a and b are each an integer of at least 1, and preferably each at most 4, and
$R^4$ denotes the residue, after removal of (a+b) glycidyl groups directly attached to an atom or atoms of oxygen, nitrogen, or sulphur, of a compound containing at least (a+b) such glycidyl groups.

Methods for the opening of 1,2-epoxide rings in glycidyl compounds by means of acrylic or methacrylic acid and with carboxylic acids, phenols, alcohols, primary amines, and sulphonic acids are well known.

It will be appreciated that, due to the manner of their formation, involving competition for epoxide groups between (meth)acrylic acid and the anthracene-containing carboxylic acid, phenol, alcohol, amine, or sulphonic acid, the compounds of formula X will be accompanied by adducts of the said compound having two or more such glycidyl groups with the anthracene derivative of formula V to IX only, and adducts of the said compound having two or more such glycidyl groups with acrylic acid or methacrylic acid only, i.e., compounds of formula two or more carboxylic acid groups per molecule with epichlorohydrin or with glycerol dichlorohydrin in the presence of an alkali. Such polyglycidyl esters may be derived from aliphatic polycarboxylic acids, e.g., succinic acid, glutaric acid, adipic acid, pimelic acid, suberic acid, azelaic acid, sebacic acid, or dimerised or trimerised linoleic acid; from cycloaliphatic polycarboxylic acids such as tetrahydrophthalic acid, 4-methyltetrahydrophthalic acid, hexahydrophthalic acid, and 4-methylhexahydrophthalic acid, and from aromatic polycarboxylic acids such as phthalic acid, isophthalic acid, and terephthalic acid. Other suitable polyglycidyl esters are obtainable by polymerisation of glycidyl esters of vinylic acids, especially glycidyl acrylate and glycidyl methacrylate.

Further examples are polyglycidyl ethers obtainable by reaction of a compound containing at least two free alcoholic hydroxyl and/or phenolic hydroxyl groups per molecule with epichlorohydrin under alkaline conditions or, alternatively, in the presence of an acidic catalyst and subsequent treatment with alkali. These ethers may be made from acyclic alcohols such as ethylene glycol, diethylene glycol, and higher poly(oxyethylene) glycols, propane-1,2-diol and poly(oxypropylene) glycols, propane-1,3-diol, poly(oxytetramethylene) glycols, pentane-1,5-diol, hexane-2,4,6-triol, glycerol, 1,1,1-trimethylolpropane, pentaerythritol, sorbitol, and

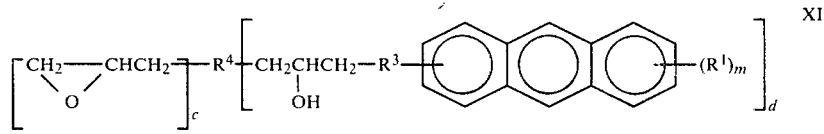

and compounds of formula

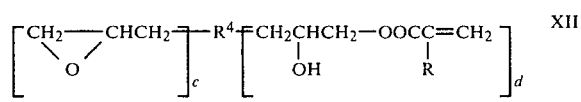

where
R has the meaning assigned in formula III,
$R^1$ and m have the meanings assigned in formula X,
$R^3$ and $R^4$ have the meanings assigned in formula X,
c represents zero or a positive integer, and
d is an integer of at least one, the sum of (c+d) being the same as the sum of (a+b).

The extent of formation of the byproducts of formula X or XI will depend, of course, on the proportions of the three types of reactants employed. In general, the presence of such byproducts does not interfere with the carrying out of the process of this invention.

As examples of compounds containing glycidyl groups which may be treated with acrylic acid or methacrylic acid and with an anthracenecarboxylic acid of formula V, a phenolic hydroxyanthracene of formula VI, an anthracene-alcohol of formula VII, an aminoanthracene of formula VIII, or an anthracenesulphonic acid of formula IX, may be mentioned polyglycidyl esters obtainable by reaction of a compound containing polyepichlorohydrins; from cycloaliphatic alcohols such as resorcitol, quinitol, bis(4-hydroxycyclohexyl)methane, 2,2-bis(4-hydroxycyclohexyl)propane, and 1,1-bis(hydroxymethyl)cyclohex-3-ene; and from alcohols having aromatic nuclei, such as N,N-bis(2-hydroxyethyl)aniline and p,p'-bis(2-hydroxyethylamino)diphenylmethane. Or they may be made from mononuclear phenols, such as resorcinol and hydroquinone, and from polynuclear phenols, such as bis(4-hydroxyphenyl)methane (otherwise known as bisphenol F), 4,4'-dihydroxydiphenyl, bis(4-hydroxyphenyl) sulphone, 1,1,2,2-tetrakis(4-hydroxyphenyl)methane, 2,2-bis(4-hydroxyphenyl)propane (otherwise known as bisphenol A), 2,2-bis(3,5-dibromo-4-hydroxyphenyl)propane, and novolaks formed from aldehydes such as formaldehyde, acetaldehyde, chloral, and furfuraldehyde, with phenol itself, and phenol substituted in the ring by chlorine atoms or by alkyl groups each containing up to nine carbon atoms, such as 4-chlorophenol, 2-methylphenol, and 4-tert.-butylphenol.

Poly(N-glycidyl) compounds may also be used, e.g., N-glycidyl derivatives of amines such as aniline, n-butylamine, bis(4-aminophenyl)methane, and bis(4-methylaminophenyl)methane; triglycidyl isocyanurate; and N,N'-diglycidyl derivatives of cyclic alkylene ureas, such as ethyleneurea and 1,3-propyleneurea, and of hydantoins such as 5,5-dimethylhydantoin.

Poly(S-glycidyl) compounds may also be used, e.g., di(S-glycidyl) derivatives of dithiols such as ethane-1,2-dithiol and bis(4-mercaptomethylphenyl) ether, but they are not preferred.

Polyepoxides having the 1,2-epoxide groups attached to different kinds of hetero atoms may be employed, e.g., the glycidyl ether-glycidyl ester of salicyclic acid, or p-(diglycidylamino)phenyl glycidyl ether.

If desired, a mixture of polyepoxides may be used.

Most preferably $R^4$ represents the divalent residue of a polyglycidyl ether, which may have been advanced, of a polyhydric phenol or of a polyhydric aliphatic alcohol.

A further method of preparing (A) comprises reaction of a polyhydric alcohol with, in either sequence, (meth)acryloyl chloride and an anthranoyl chloride of formula

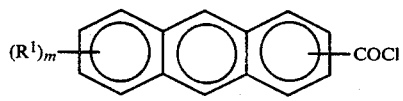  XIII where $R^1$ and m have the meanings assigned in formula IV, such as anthracene-9-carboxylic acid chloride and anthracene-2-carboxylic acid chloride, or an isocyanatoanthracene of formula

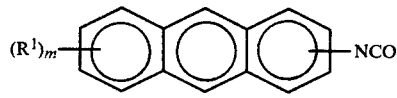  XIV where $R^1$ and m have the meaning assigned in formula IV, such as 2-isocyanatoanthracene or 9-isocyanatoanthracene.

There may accordingly be used compounds of formula

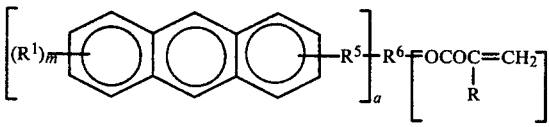  XV where
R has the meaning assigned in formula III,
$R^1$ and m have the meanings assigned in formula IV,
a and b have the meanings assigned in formula X,
$R^5$ denotes a group of formula —COO— or —NH-COO— and
$R^6$ denotes the residue, after removal of (a+b) alcoholic hydroxyl groups, of a polyhydric alcohol containing at least (a+b) such hydroxyl groups.

Preferably $R^6$ denotes an aliphatic residue comprising repeating units of formula —(CH$_2$)$_n$— where n represents 2, 3, or 4, or of formula

Thus, $R^6$ may, for example, represent the residue of a polyoxyethylene glycol or polyoxypropylene glycol of average molecular weight 250 to 5000, or the residue of a polyvinyl alcohol of average molecular weight 500 to 9000.

It will be understood that, as a consequence of the competition for reaction with the alcoholic hydroxyl groups between, on the one hand the anthranoyl chloride of formula XIII or the isocyanato-anthracene of formula XIV and, on the other, the (meth)acryloyl chloride, there will likewise be formed byproducts of formula

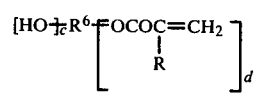  XVI and of formula

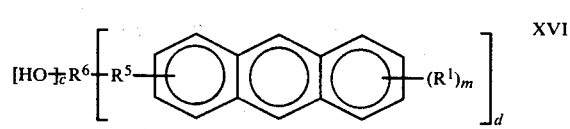  XVI where
R has the meaning assigned in formula III,
$R^1$ and m have the meanings assigned in formula IV,
$R^5$ and $R^6$ have the meanings assigned in formula XV, and
c and d have the meanings assigned in formulae XI and XII, their proportions depending on the relative amounts of the reactants utilised; however, they do not interfere.

Methods for the reaction of acid chlorides with alcohols to form esters, and of isocyanates with alcohols to form urethanes, are well known.

With polyhydric alcohols having 3 or more alcoholic hydroxyl groups, acetals may be formed by reaction with an anthracene-containing aldehyde of formula

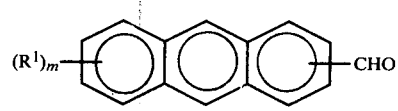  XVIII where $R^1$ and m have the meanings assigned in formula IV, such as anthracene-9-aldehyde, and simultaneously or in either order the other alcoholic hydroxyl group or groups may be converted into (meth)acryloyloxy groups by reaction with (meth)acryloyl chloride.

Accordingly, there may be used as (A) ester-acetals containing in the molecule at least one group of formula

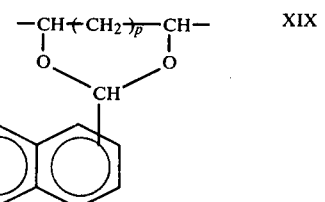  XIX and at least one group of formula

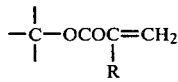

where

R has the meaning assigned in formula III,

R$^1$ and m have the meanings assigned in formula IV, and p denotes zero, 1, 2, or 3.

Conveniently the compound (A) is formed from a polyvinyl alcohol of average molecular weight 500 to 9000.

It will likewise be appreciated that byproducts may be formed containing groups of III and none of IV, or vice versa, but such byproducts do not interfere with the process of the invention.

A further route to compounds suitable for use as (A) utilises polyamines. In either sequence or simultaneously, a polyamine is reacted with (meth)acryloyl chloride and an anthranoyl chloride of formula XIII or else an isocyanatoanthracene of formula XIV.

There may thus be used the amides of formula

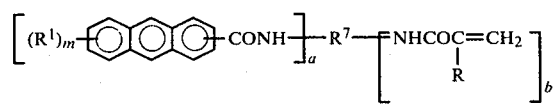

XXI and the urea-amides of formula

XXII where

R has the meaning assigned in formula III,

R$^1$ and m have the meanings assigned in formula IV, a and b have the meanings assigned in formula X, and R$^7$ denotes the residue, after removal of (a+b) primary amino groups, of a compound containing at least (a+b) such amino groups.

Likewise, byproducts of formula

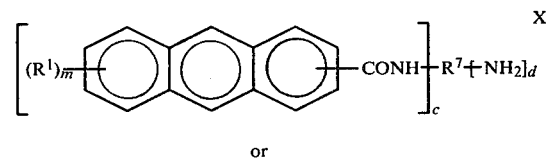

XXIII or

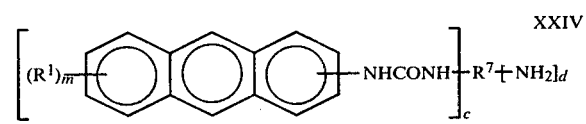

XXIV and

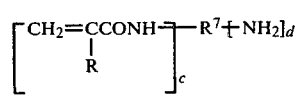

XV where

R has the meaning assigned in formula III,

R$^1$ and m have the meanings assigned in formula IV,

R$^7$ has the meaning assigned in formulae XXI and XXII, and c and d have the meanings assigned in formulae XI and XII, will be formed, but they do not interfere.

Yet other compounds suitable for use as (A) are amides obtainable by treatment of a 9-anthrylmethylamine with (meth)acryloyl chloride, i.e., compounds of the general formula

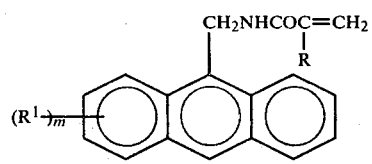

XXVI where

R has the meaning assigned in formula III and

R$^1$ and m have the meanings assigned in formula IV.

9-Anthrylmethylamine is obtainable from 9-anthracene-aldehyde by reaction with hydrogen in the presence of ammonia.

Other ways of preparing compounds suitable for use as (A) comprise reaction of a hydroxyanthracene of formula VI, an anthracene-containing alcohol of formula VII, or an aminoanthracene of formula VIII with (meth)acryloyl chloride. There may thus be used esters of the general formula

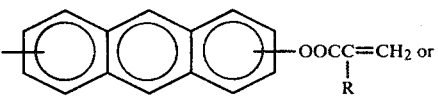

XXVII

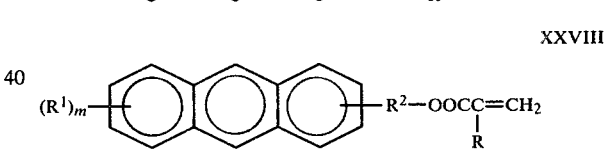

XXVIII and amides of the general formula

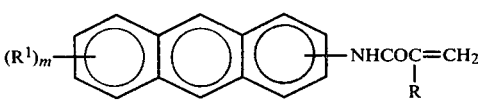

XXIX where

R has the meaning assigned in formula III,

R$^1$ and m have the meanings assigned in formula IV, and

R$^2$ has the meaning assigned in formula VII.

Particularly preferred as compound (A) are esters formed by reaction of an anthracenecarboxylic acid with glycidyl (meth)acrylate, i.e., those of formula

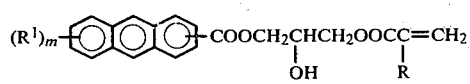

XXX where

R has the meaning assigned in formula III, and

R$^1$ and m have the meanings assigned in formula IV.

Compounds of formula XXX may also be prepared by reaction of the glycidyl anthracenecarboxylate with (meth)acrylic acid.

Especially preferred for use as (A) are 3-(acryloyloxy)-2-hydroxypropyl anthracene-9-carboxylate, 3-(methacryloyloxy)-2-hydroxypropyl anthracene-9-carboxylate, and 9-anthrylmethyl acrylate.

It is greatly preferred that the liquid composition contain an added photoinitiator, i.e., a catalyst which, on irradiation, gives an excited state that leads to formation of free radicals which then initiate polymerisation of (A). Examples of suitable photoinitiators are organic peroxides and hydroperoxides, α-halogen substituted acetophenones such as trichloromethyl 4'-tert. butylphenyl ketone, α-hydroxy-α-alkyl-substituted acetophenones such as 2-hydroxy-2-methyl-1-phenyl-propan-1-one, benzoin and its alkyl ethers (e.g., the n-butyl ether), α-methylbenzoin, alkyl, α,α-dialkoxy-α-benzoylacetates, benzophenones such as benzophenone itself and 4,4'-bis(dimethylamino)benzophenone, O-alkoxycarbonyl derivatives of an oxime of benzil or of 1-phenylpropane-1,2-dione, such as benzil (O-ethoxycarbonyl)-α-monoxime and 1-phenylpropane-1,2-dione 2-(O-ethoxycarbonyl)oxime, benzil ketals, e.g., its dimethyl ketal, substituted thioxanthones, e.g., 2-chlorothioxanthone, anthraquinones, esters of phenylglyoxylic acid, 2-benzoyl-2-phenyl-1,3-dioxolanes and 4-benzoyl-4-phenyl-1,3-dioxolanes, and photoredox systems comprising a mixture of a phenothiazine dye (e.g., methylene blue) or a quinoxaline (e.g., a metal salt of 2-(m- or p-methoxyphenyl)-quinoxaline-6' or 7'-sulphonic acid) with an electron donor such as benzenesulphinic acid or other sulphinic acid or a salt thereof such as the sodium salt, or an arsine, a phosphine, or thiourea.

Suitable photoinitiators are readily found by routine experimentation. Generally, 0.15 to 10%, and preferably 2.5 to 5%, by weight of the photoinitiator is incorporated, based on the total weight of (A) and any further compound (B) present containing at least one group of formula III but none of formula IV. (Substances suitable for use as compound (B) are described below.)

References in this Specification to photocrosslinking through groups of formula IV are not to be construed as precluding the possibility that a minor amount of photodimerisation in stage (1) may take place through groups of formula IV; it is believed, however, that the great preponderance of photopolymerisation in stage (1) involves only groups of formula III.

As stated above, the composition is applied in a liquid form to a carrier. Conveniently its viscosity is in the range 0.1 to 0.4 Pa s. To meet the requirement that the composition be liquid it may be necessary, in order to achieve this without the use of volatile organic solvents, to include another compound which is a liquid and which photopolymerises under the conditions in stage (1) to form a solid. It is preferred to use for this purpose a photopolymerisable compound (B) having in the molecule at least one group of formula III but none of formula IV. Compound (B) may be, for example, an alkyl or hydroxyalkyl ester (which alkyl or hydroxyalkyl groups may be substituted) or acrylic acid or methacrylic acid, typically, such esters having up to 15 carbon atoms in all, such as methyl methacrylate, ethyl methacrylate, n-butyl acrylate, and 2-hydroxyethyl acrylate. Also useful for this purpose are 3-alkoxy-2-hydroxypropyl, 3-alkenoxy-2-hydroxypropyl, and 3-aryloxy-2-hydroxypropyl esters of acrylic acid or methacrylic acid, typically, those containing up to 15 carbon atoms in all.

Other kinds of compound (B) may be included in the liquid composition so that some desired property may be imparted to the photopolymerised, photocrosslinked product. Thus, to impart flame-retardant properties the compound (B) may also contain at least one chlorine, bromine, or phosphorus atom. Examples of such are adducts of acrylic acid or methacrylic acid with a bromine- or chlorine-substituted aryl glycidyl ether such as a dibromo-p-cresyl glycidyl ether, e.g., 3-(methacryloyloxy)-2-hydroxypropyl X,Y-dibromo-p-cresyl ether.

As is explained below, it may be desirable to introduce epoxide groups into the composition: after the product has been photocrosslinked, additional crosslinking may be achieved by thermal curing through epoxide groups. It may therefore be advantageous to include in the liquid composition a photopolymerisable compound having in the same molecule both a group of formula III and only one 1,2-epoxide group, such as glycidyl acrylate or glycidyl methacrylate. Alternatively, an epoxide resin (i.e., a compound containing more than one epoxide group) may be included in the liquid compositions before photopolymerisation.

If desired the liquid composition may likewise contain a photopolymerisable compound (C) having at least one group of formula IV but none of III, e.g., 1-(2-anthryl)ethanol.

The liquid composition can be applied to suitable carriers by the customary techniques, such as spray coating, whirler coating, roller coating, cascade coating, and especially curtain coating. Typically, the carrier is coated such that the layer of the composition is 1 to 250 μm thick. The carrier may be of, for example, copper, aluminium or other metal, paper, synthetic resin, or glass.

In both the photopolymerising and the subsequent photocrosslinking stage of the process of this invention actinic radiation of wavelength 200–600 nm is preferably used. Suitable sources of actinic radiation include carbon arcs, mercury vapour arcs, fluorescent lamps with phosphors emitting ultraviolet light, argon and xenon glow lamps, tungsten lamps, and photographic flood lamps. Of these, mercury vapour arcs, particularly sun lamps, fluorescent sun lamps, and metal halide lamps are most suitable. The times required for the exposures of the photopolymerisable composition and the still photocrosslinkable composition will depend upon a variety of factors which include, for example, the individual compounds used, the type of light source, and the distance of that source from the irradiated composition. Suitable times may be readily determined by those familiar with photopolymerisation techniques; usually, the amount of light energy required in the second stage (the photocrosslinking stage) is 15 to 100 times that required in the first stage, typically, 25 to 60 times. By way of example, the composition is first irradiated with a 500 watt bulb at a distance of 10–25 cm from a source of irradiation for 5–15 seconds; in the second stage it is irradiated for 10–20 minutes at a distance of 15–30 cm. With more powerful sources of irradiation, e.g., of 5 killowatts, the irradiation times, particularly in the second stage, may be much shorter.

The preferred substances for use as compound (A) contain only one group of formula III per molecule, but satisfactory results have been achieved with substances containing more than one such group. Where diacrylates, dimethacrylates and other substances containing more than one group of formula III are used, exposure to actinic radiation in stage (1) should be restricted so that any crosslinking in that stage through groups of formula III does not proceed to an extent such that formation of an image in stage (3) is substantially inhibited.

Suitable solvents for development of the image are readily found by routine testing and include cyclohexanone, trimethylcyclohexanone, acetone, toluene, 2-ethoxyethanol, 1,1,1-trichloroethane, methylene chloride, and mixtures thereof. The action of the solvent may need to be assisted by agitation or by gentle brushing. Where the carrier has a layer of a suitable electrically-conducting metal, usually copper or silver, immediately in contact with the photopolymerised composition, uncrosslinked polymer can be removed by development to expose the metal. Metal so exposed may then be etched away in the non-image areas, so forming a printed circuit, by means of etching fluids such as ferric chloride or ammonium persulphate solutions.

If desired, it is possible to include in the liquid composition a compound (B) which also has at least one free sulphonic or phosphoric acid group, or particularly at least one free carboxylic acid group; conveniently, this is acrylic acid or methacrylic acid or an adduct of a hydroxyalkyl acrylate or methacrylate with trimellitic anhydride, i.e., a compound of formula

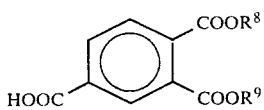  XXXI where either $R^8$ denotes a hydrogen atom, in which case $R^9$ denotes a group of formula

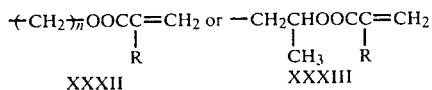

XXXII    XXXIII or $R^8$ denotes a group of formula XXXI or XXXII, in which case $R^9$ denotes a hydrogen atom,
wherein
R has the meaning assigned in formula III and
n represents 2, 3, or 4.

The presence of free sulphonic, phosphoric, or carboxylic acid groups in the photopolymerised polymer has as a consequence the facility of using an aqueous solution of a base, such as dilute sodium hydroxide, sodium carbonate, disodium hydrogen orthophosphate, or ammonia solutions for development, thus avoiding the use of organic solvents in this stage.

Alternatively, there may be included in the liquid composition a compound (B) which also has at least one primary, secondary, or tertiary amino group. As a consequence of the presence of free amino groups in the photopolymerised polymer, aqueous solutions of acids may be used as the developer, such as dilute solutions of mineral acids. Examples of such compounds (B) are alkyl esters of acrylic or methacrylic acid, which alkyl groups are substituted by a secondary or tertiary amino group, such as 2-(dimethylamino)ethyl methacrylate.

As has already been indicated, the composition after photopolymerisation and photocrosslinking may contain an epoxide resin in which case it may also contain a latent, heat-curing agent for the epoxide resin so that the composition may be heated and supplementary crosslinking occur, further to increase the resistance of the photocrosslinked product to solvents and high temperatures. The epoxide resin may, as already stated, be included as such in the composition or may be formed in situ through photopolymerisation of a compound (B) which also contains in the same molecule only one 1,2-epoxide group. Examples of latent, heat-curing agents for epoxide resins are polycarboxylic acid anhydrides, such as hexahydrophthalic anhydride, dicyandiamide, complexes of amines such as ethylamine, trimethylamine, and n-octyldimethylamine with boron trifluoride or with boron trichloride, latent boron difluoride chelates, aromatic polyamines such as bis(p-aminophenyl)methane and bis(p-aminophenyl) sulphone, aromatic biguanides such as 2,6-xylidene biguanide, and imidazoles such as 2-ethyl-4-methylimidazole and 2-phenylimidazole.

The following Examples illustrate the invention. Unless otherwise indicated, parts and percentages are by weight. Substances used in the Examples were prepared as follows:

3-(Methacryloyloxy)-2-hydroxypropyl anthracene-9-carboxylate

Anthracene-9-carboxylic acid (50 g) was added over 30 minutes with stirring to glycidyl methacrylate (33.9 g, epoxide content 6.6 equiv./kg) containing 0.13 g of 2,6-di-tert.butyl-p-cresol and 0.25 g of tetramethylammonium chloride and heated to 100° C. Heating at 100° C. was continued for a further 4 hours, by which time the epoxide content of the mixture had fallen to a negligibly low value. The resultant product was a brown, glassy solid.

2-(p-(3-(Methacryloyloxy)-2-hydroxypropyl)phenyl)-2-(p'-(3-(anthracene-9-carbonyloxy)-2-hydroxypropyl)phenyl)propane Methacrylic acid (12 g) was added dropwise over 1½ hours to a stirred mixture, heated to 100° C., of the diglycidyl ether of 2,2-bis(p-hydroxyphenyl)propane (50 g) containing 0.15 g of tetramethylammonium chloride and 0.1 g of 2,6-di-tert.butyl-p-cresol. After the mixture had been stirred for a further 1¾ hours at 100° C. anthracene-9-carboxylic acid (31 g) was added in portions over 1 hour 10 minutes. After the mixture had been stirred for a further 3 hours its epoxide content was negligible.

The product, used as formed, comprised the above compound together with the by-products, 2,2-bis(p-(3-(methacryloyloxy)-2-hydroxypropyl)phenyl)propane and 2,2-bis(p-(3-anthracene-9-carbonyloxy)-2-hydroxypropyl)phenyl)propane.

9-Anthrylmethyl acrylate

A mixture of 9-hydroxymethylanthracene (20.8 g, 0.1 mol) and triethylamine (11.1 g, 0.11 mol), containing 0.05 g of 2,6-di-tert.butyl-p-cresol, in 200 ml of freshly distilled diethyl ether was cooled with stirring to 0° C., and the temperature of the mixture was kept at about this level while acryloyl chloride (9.32 g, 0.103 mol) was added. The mixture was then warmed to refluxing temperature and heated to reflux for 2 hours. After the mixture had been cooled, 200 ml. of water was added, and the two layers were separated. The organic layer was washed twice with 50 ml portions of cold 10% sulphuric acid and then with a saturated aqueous solution of sodium bicarbonate, while the aqueous acid layer was extracted further with dichloromethane, and the organic layer was washed with a saturated aqueous solution of sodium bicarbonate. Finally, the two organic solutions were mixed, dried over anhydrous magnesium sulphate, and the solvents distilled off. There remained 11.1 g of the title compound as a yellow, semicrystalline oil. It solidified on standing and then had m.pt. 120°–125° C.

3-(Methacryloyloxy)-2-hydroxypropyl X,Y-dibromo-p-cresyl ether

To 250 g of commercially-available X,Y-dibromo-p-cresyl glycidyl ether (epoxide content 2.76 equiv./kg., calculated value 3.11) were added 2,6-di-tert.butyl-p-cresol (0.5 g) and 1 g of tetramethylammonium chloride, and the solution was heated to 100° C. with stirring. Methacrylic acid (59.34 g) was added slowly over 1 hour at a rate such that the temperature of the mixture did not exceed 105° C. Heating at 100° C. was continued until the epoxide content had fallen to a negligibly low level. The product was a clear, viscous liquid.

EXAMPLE 1

A mixture, having a viscosity of 0.2–0.3 Pa s and comprising 27.5 parts of glycidyl methacrylate, 67.5 parts of 3-(methacryloyloxy)-2-hydroxypropyl anthracene-9-carboxylate, and 5 parts of benzil dimethyl ketal was applied by spin coater as a layer approximately 20 μm thick on copper plate. The film was irradiated for 7 seconds at a distance of 20 cm by a lamp (80 w per cm), becoming tack-free. It as then irradiated through an image with a 30 w per cm lamp for 15 minutes at a distance of 25 cm. The image was developed by agitation in cyclohexanone-1,1,1-trichloroethane (1:1 by volume) a good relief image being obtained.

EXAMPLE 2

The procedure of Example 1 was repeated except that in place of the glycidyl methacrylate 27,5 parts of 2-hydroxyethyl acrylate was used. A good relief image was also obtained.

EXAMPLE 3

A mixture comprising 5 parts of glycidyl methacrylate, 45 parts of 3-(methacryloyloxy)-2-hydroxypropyl X,Y-dibromo-p-cresyl ether, 45 parts of 3-(methacryloyloxy)-2-hydroxypropyl anthracene-9-carboxylate, and 5 parts of benzil dimethyl ketal was irradiated under the conditions successively employed in Example 1. A good relief image was likewise obtained on development.

EXAMPLE 4

In this Example a latent, heat-curing agent for epoxide resins, viz., boron trichloride-trimethylamine complex, is incorporated so as to bring about heat-curing of the epoxide resin formed in situ by photopolymerisation of glycidyl methacrylate.

A formulation comprising of 50 parts of the mixture containing 2-(p-(3-methacryloyloxy)-2-hydroxypropyl)-2-(p'-(3-(anthracene-9-carbonyloxy)-2-hydroxypropyl)phenyl)propane, prepared as described above, 30 parts of 3-(methacryloyloxy)-2-hydroxypropyl X,Y-dibromo-p-cresyl ether, 20 parts of glycidyl methacrylate, 4 parts of benzil dimethyl ketal, and 4 parts of boron trichloride-trimethylamine complex was applied as a coating 10 μm thick onto a copper-clad laminate, and irradiated under a medium pressure mercury lamp (80 w per cm) at 20 cm distance for 10 seconds. A tack-free coating was obtained. Next, a negative was placed on top of the coating and the sample was irradiated at a distance of 25 cm. for 20 minutes with a 30 w per cm medium pressure mercury lamp. Development in toluene gave a good image, that withstood 10 rubs with a cotton wool swab soaked in acetone. After the image had been heated for 1 hour at 140° C. the solvent resistance was further increased, the image being scarcely effected by 20 such rubs.

EXAMPLE 5

A mixture comprising 50 parts of 9-anthrylmethyl acrylate, 25 parts of glycidyl acrylate, and 6 parts of benzil dimethyl ketal was applied onto copper plate and irradiated under the conditions successively employed in Example 1 except that it was irradiated for 30 seconds in the first stage. On development with 1,1,1-trichloroethane an image was obtained.

COMPARATIVE EXAMPLE

For purposes of comparison only, a mixture comprising 66 parts of 9-hydroxymethylanthracene, 33 parts of allyl acrylate, and 8 parts of benzil dimethyl ketal was applied as a layer and irradiated as described in Example 1 except that it was necessary to irradiate in the first stage for 30 seconds to obtain a tack-free coating. However, the further irradiation through a photographic negative did not lead to further crosslinking, since on attempted development of an image with cyclohexanone the whole film dissolved.

What is claimed is:

1. A process for production of an image which comprises
   (1) exposing to actinic radiation a layer, supported on a carrier, of a liquid composition containing a photoinitiator and a compound (A) having in the same molecule both at least one group of formula

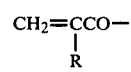

and at least one group of formula

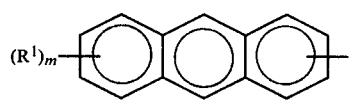

where
R denotes a hydrogen atom or a methyl group,
R¹ denotes a chlorine or bromine atom, a methyl group, or a nitro group, and
m is zero, 1, or 2,
such that the layer solidifies and becomes essentially nontacky due to photopolymerisation of (A) through the group or groups of formula III but remains substantially photocrosslinkable, and subsequently,
   (2) exposing the layer so solidified through an image-bearing transparency consisting of substantially opaque and substantially transparent parts to a substantially greater amount of actinic radiation such that the further exposed part or parts of the photopolymerised layer undergo photocrosslinking through the group or groups of formula IV, and (3) developing the image by dissolving in a solvent the part or parts of the layer which have not become photocrosslinked.

2. The process of claim 1 in which (A) contains, per average molecule, up to four groups of formula III.

3. The process of claim 1 in which (A) contains, per average molecule, up to four groups of formula IV.

4. The process of claim 1 in which a group of formula III is directly attached to an atom of carbon, oxygen, or nitrogen.

5. The process of claim 1 in which a group of formula IV is directly attached to an atom of carbon, oxygen, or nitrogen.

6. The process of claim 1 in which (A) is of the formula

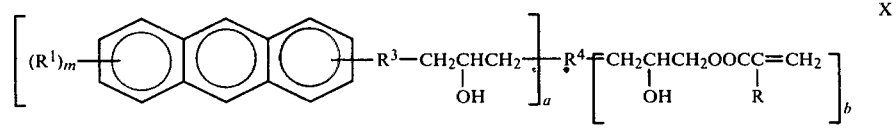

where
a and b are each independently an integer of at least 1,
$R^3$ denotes a group of formula —COO—, —O—, —$R^2$O—, —NH—, or —$SO_3$—, where $R^2$ represents an alkylene or alkylidene group of 1 to 4 carbon atoms, and
$R^4$ denotes the residue, after removal of (a+b) glycidyl groups directly attached to atoms of oxygen, nitrogen, or sulfur, of a compound containing at least (a+b) such glycidyl groups.

7. The process of claim 1 in which (A) is of the formula

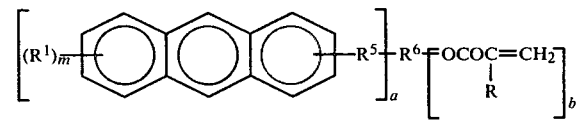

XV where
a and b are each independently an integer of at least 1,
$R^5$ denotes a group of formula —COO— or —NHCOO—, and
$R^6$ denotes the residue, after removal of (a+b) alcoholic hydroxyl groups, of a compound containing at least (a+b) such hydroxyl groups.

8. The process of claim 1 in which (A) is an estera-cetal containing in the molecule at least one group of formula

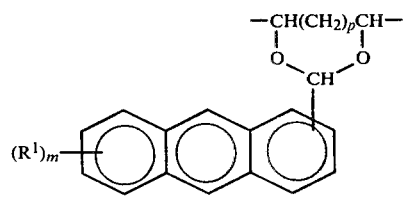

XIX and at least one group of the formula

XX where p denotes zero, 1, 2, or 3.

9. The process of claim 1 in which (A) is an amide of formula

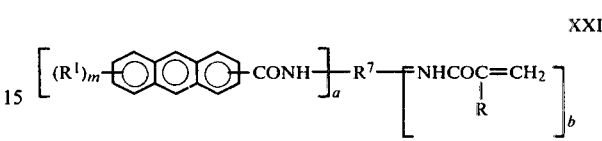

XXI

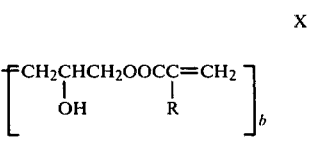

X or a urea-amide of formula

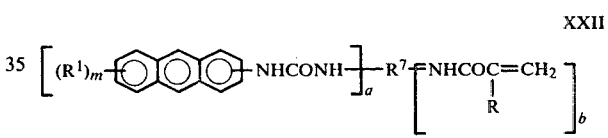

XXII where
a and b are each independently an integer of at least 1, and
$R^7$ denotes the residue, after removal of (a+b) primary amino groups, of a compound containing at least (a+b) such amino groups.

10. The process of claim 1 in which (A) is of the general formula

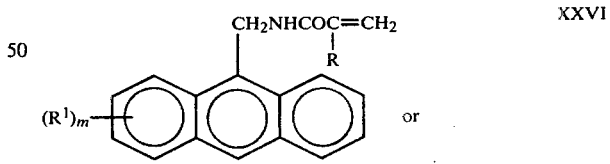

XXVI or

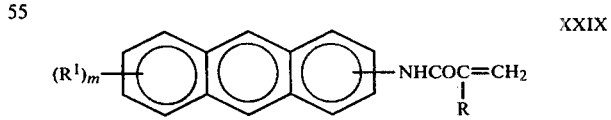

XXIX

11. The process of claim 1 in which (A) is of the general formula

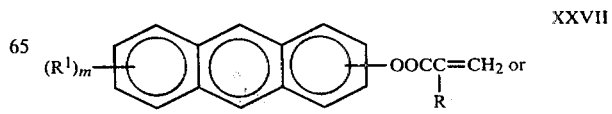

XXVII

-continued

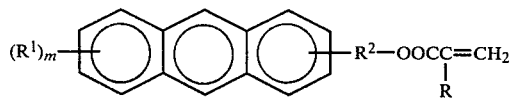
XXVIII where $R^2$ represents an alkylene or alkylidene group of 1 to 4 carbon atoms.

12. The process of claim 1 in which (A) is an ester of the formula

XXX

13. The process of claim 1 in which at least one group of formula IV is a 1-anthryl, 2-anthryl, or 9-anthryl group.

14. The process of claim 1 in which (A) is 3-(acryloyloxy)-2-hydroxypropyl anthracene-9-carboxylate, 3-(methacryloyloxy)-2-hydroxypropyl anthracene-9-carboxylate, or 9-anthrylmethyl acrylate.

15. The process of claim 1 in which the composition further contains a photopolymerisable compound (B) having in the same molecule at least one group of formula III but none of formula IV and also at least one free sulfonic, phosphonic, or carboxylic acid group, and the solvent employed is an aqueous solution of a base.

16. The process of claim 1 in which the composition further contains a photopolymerisable compound (B) having in the molecule at least one group of formula III but none of formula IV and also at least one primary, secondary, or tertiary amino group, and the solvent employed is an aqueous solution of an acid.

* * * * *